(12) United States Patent
Itozaki et al.

(10) Patent No.: US 6,603,308 B2
(45) Date of Patent: Aug. 5, 2003

(54) SUPERCONDUCTING MAGNETIC SENSOR HAVING A CRYOSTET WITH A FLUX GUIDE

(75) Inventors: Hideo Itozaki, Itami (JP); Tatsuoki Nagaishi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/959,823

(22) PCT Filed: Mar. 6, 2001

(86) PCT No.: PCT/JP01/01725

§ 371 (c)(1),
(2), (4) Date: Nov. 8, 2001

(87) PCT Pub. No.: WO01/67123

PCT Pub. Date: Sep. 13, 2001

(65) Prior Publication Data

US 2002/0158630 A1 Oct. 31, 2002

(30) Foreign Application Priority Data

Mar. 10, 2000 (JP) .......................................... 2000-67467

(51) Int. Cl.[7] ...................... G01R 33/035; G01R 33/12; G01N 27/72
(52) U.S. Cl. .......................... 324/248; 62/51.1; 505/846
(58) Field of Search ................................. 324/248, 260, 324/262; 250/306; 62/51.1; 505/162, 845, 846; 600/409

(56) References Cited

U.S. PATENT DOCUMENTS 5,349,291 A  9/1994  Kotani et al.
6,211,673 B1 * 4/2001 Gerber et al. ............... 324/262

FOREIGN PATENT DOCUMENTS

| JP | 1-124781 | 5/1989 |
| JP | 3-53182 | 3/1991 |
| JP | 4-43977 | 2/1992 |

OTHER PUBLICATIONS

Y. Tavrin et al., "New type of HTS–SQUID microscope for operation without shielding", Inst. Phys. Conf. Ser. No. 158, Jun. 30–Jul. 3, 1997, pp. 719–722.

* cited by examiner

Primary Examiner—Walter E. Snow
(74) Attorney, Agent, or Firm—McDermott, Will & Emery

(57) ABSTRACT

According to this invention, a magnetic sensor (1) for measuring a magnetic field distribution of a measurement target S by using a SQUID (2) is characterized by including a storing portion (10) with an interior held in a vacuum state to store the SQUID (2), and a substantially needle-like flux introducing member (30) made of a high-permeability material to guide a magnetic flux from the measurement target (S) to the SQUID (2), wherein the flux introducing member (30) has one end (30a) located in the storing portion (10) to be away from the SQUID (2) and the other end (30b) located outside the storing portion (10).

3 Claims, 2 Drawing Sheets

SUPERCONDUCTING MAGNETIC SENSOR HAVING A CRYOSTET WITH A FLUX GUIDE

TECHNICAL FIELD

The present invention relates to a magnetic sensor for measuring the magnetic field of a measurement target with a SQUID (Superconducting Quantum Interference Device).

BACKGROUND ART

Conventionally, as a magnetic sensor for measuring the two-dimensional magnetic field distribution of a measurement target, one which guides a magnetic flux from the measurement target to a SQUID through a needle-like flux introducing member is known. When a needle-like flux introducing member is used in this manner, the magnetic field of the measurement target can be measured in units of small regions, so the position resolution can be improved. In the magnetic sensor using the SQUID in this manner, the SQUID must be cooled to an operating temperature. For this reason, the SQUID, needle-like flux introducing member, and measurement target are all arranged in a vacuum container in order to prevent external heat transfer by vacuum heat insulation.

DISCLOSURE OF INVENTION

The above conventional magnetic sensor has the following problems. More specifically, in order to hold the SQUID at a low temperature, the measurement target is also set in the vacuum container, as described above. Accordingly, a cumbersome operation of placing the measurement target in the vacuum container is necessary, which takes time for measurement preparation. To facilitate measurement preparation while cooling the SQUID, the measurement target may be set outside the vacuum container. This increases a distance from the measurement target to the needle-like flux introducing member, and the measurement precision of the magnetic field distribution degrades.

The present invention has been made in view of the above situation, and has as its object to provide a magnetic sensor in which a cooling efficiency for a SQUID is high and measurement preparation is easy, and which can perform magnetic field measurement at high precision.

In order to achieve the above object, according to the present invention, a magnetic sensor for measuring a magnetic field distribution of a measurement target by using a SQUID is characterized by comprising a storing portion with an interior held in a vacuum state to store the SQUID, and a rod-like flux introducing member made of a high-permeability material to guide a magnetic flux from the measurement target to the SQUID, wherein the flux introducing member has one end located in the storing portion to be away from the SQUID and the other end located outside the storing portion.

The magnetic sensor according to the present invention has the rod-like flux introducing member with one end located in the storing portion and the other end located outside the storing portion. The magnetic flux from the measurement target can be guided to the SQUID by moving that side of the flux introducing member which is located outside the storing portion to the measurement target. In this manner, according to the present invention, since the other end side of the flux introducing member is located outside the storing portion, the distance between the flux introducing member and measurement target can be decreased even if the measurement target is not set in the container. Thus, cumbersome measurement preparation is not required, and measurement precision for the magnetic field distribution can be improved. Since one end of the flux introducing member is away from the SQUID, heat from the other end side of the flux introducing member is not easily transferred to the SQUID, so the SQUID can be cooled efficiently.

Preferably, a flux absorbing member made of a high-permeability material is further provided around the flux introducing member in order to surround a portion of the flux introducing portion which is located outside the storing portion. When this arrangement is employed, the external magnetic flux from except the measurement target can be absorbed by the flux absorbing member. Thus, the measurement precision for the magnetic field distribution of the measurement target can be further improved.

BEST MODE OF CARRYING OUT THE INVENTION

Figure 1:
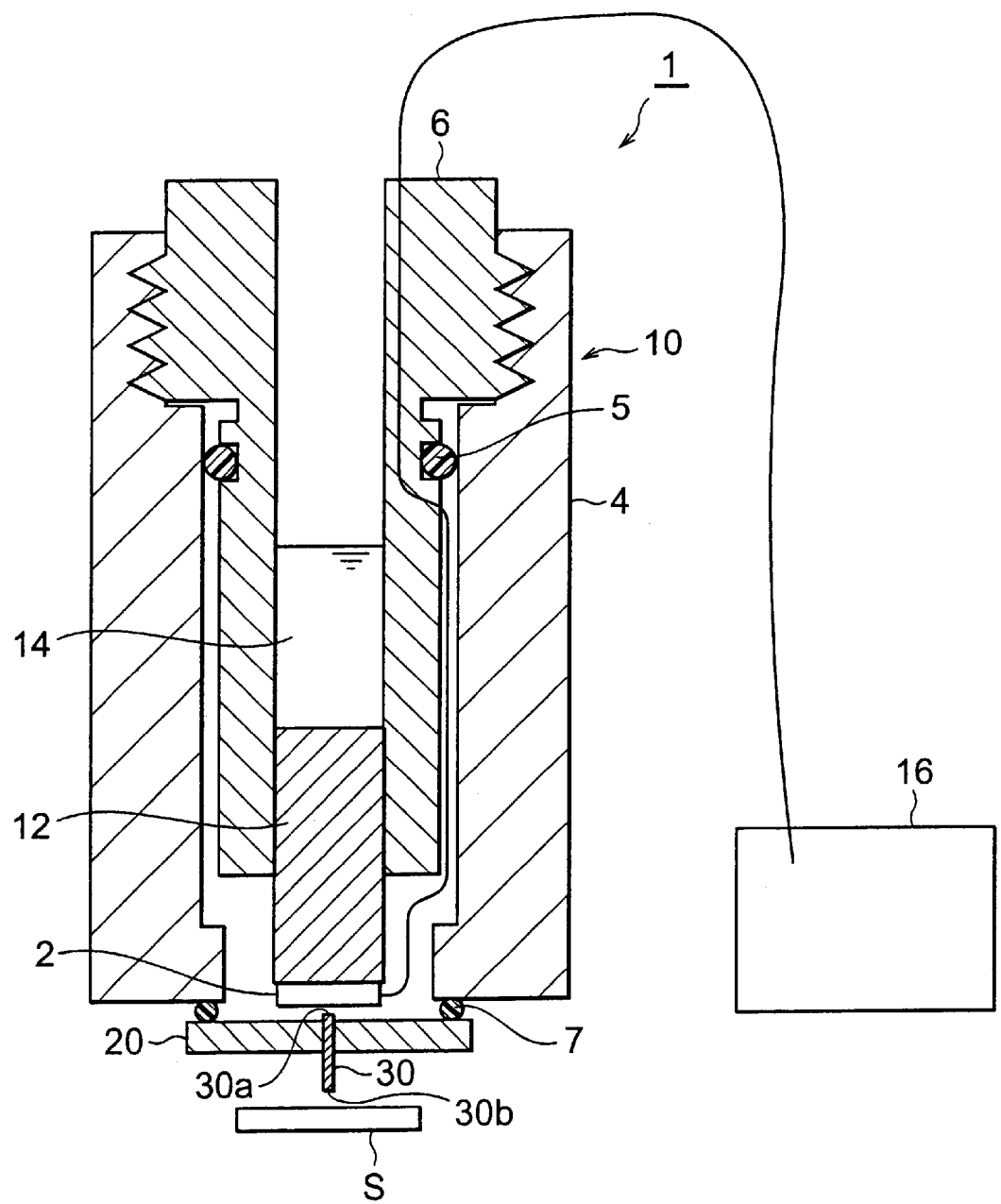
FIG. 1 is a sectional view showing a magnetic sensor according to the first embodiment of the present invention.

Magnetic sensors according to preferred embodiments of the present invention will be described in detail with reference to the accompanying drawings. Note that the same elements are denoted by the same reference numerals, and a repetitive explanation thereof will be omitted.

[First Embodiment]

FIG. 1 is a sectional view showing a magnetic sensor 1 according to this embodiment. The magnetic sensor 1 measures the two-dimensional magnetic field distribution of a measurement target S with a SQUID 2 stored in a storing portion 10. The storing portion 10 is comprised of an outer cylinder 4, an inner cylinder 6 screwed into the outer cylinder 4, and a bottom lid 20 for sealing the lower end of the outer cylinder 4, and its interior is held in a vacuum state. The bottom lid 20 is drawn to the outer cylinder 4 by vacuum suction through an O-ring 7. Although the bottom lid 20 is made of a glass epoxy material, the material of the bottom lid 20 can be changed in various manners as far as it is a nonmagnetic material. To facilitate observation of the interior, the bottom lid 20 may be made of transparent glass.

A needle-like (rod-like) flux introducing member 30 is inserted at the center of the bottom lid 20. The flux introducing member 30 serves to guide the magnetic flux from the measurement target S to the SQUID 2, and has an upper end 30a located in the storing portion 10, i.e., in the vacuum region, to be away from the SQUID 2, and a lower end 30b located outside the storing portion 10, i.e., in the atmosphere. The measurement target S is set below the lower end 30b of the flux introducing member 30. The flux introducing member 30 is made of permalloy, which is a high-permeability material. An O-ring 5 is fitted between the outer cylinder 4 and inner cylinder 6 in order to perform vacuum sealing.

A sapphire rod 12 is fitted in the lower portion of the inner cylinder 6. The SQUID 2 is adhered to the lower surface of the sapphire rod 12, and liquid nitrogen 14 for cooling the SQUID 2 stays above the sapphire rod 12. Namely, the sapphire rod 12 serves to transfer heat of the SQUID 2 to the liquid nitrogen 14. The magnetic sensor 1 has a controller 16 for calculating the two-dimensional magnetic field of the measurement target S on the basis of an output from the SQUID 2.

With this arrangement, the two-dimensional magnetic field distribution of the measurement target S is measured by moving the measurement target S and magnetic sensor 1 two-dimensionally relative to each other. More specifically, first, the magnetic flux from the measurement target S enters the SQUID 2 through the flux introducing member 30. When the magnetic flux is applied to the SQUID 2, the SQUID 2 transmits an output signal to the controller 16. The controller 16 can calculate the two-dimensional magnetic field distribution of the measurement target S on the basis of this signal.

In the magnetic sensor 1 according to this embodiment, since the lower end 30b of the flux introducing member 30 is located outside the storing portion 10, the distance between the flux introducing member 30 and measurement target S can be decreased even if the measurement target S is not set in the storing portion 10. The measurement precision for the magnetic field distribution of the measurement target S can thus be increased without performing cumbersome measurement preparation. Since the upper end 30a of the flux introducing member 30 is away from the SQUID 2, heat from the lower end 30b of the flux introducing member 30 located in the atmosphere is not easily transferred to the SQUID 2, so the SQUID 2 can be cooled efficiently. Since the flux introducing member 30 has a needle-like shape, it can measure the magnetic field of the measurement target S in units of small regions. Thus, the position resolution of the magnetic sensor 1 is improved, and the measurement precision for the magnetic field distribution of the measurement target S can be further improved.

In this embodiment, the flux introducing member 30 is made of permalloy. Alternatively, the flux introducing member 30 can be made of other various types of high-permeability materials, e.g., electromagnetic pure iron, a silicon steel plate, Yandust, or the like. The high-permeability material of this embodiment preferably has a relative permeability of 200 or more.

[Second Embodiment]

Figure 2:
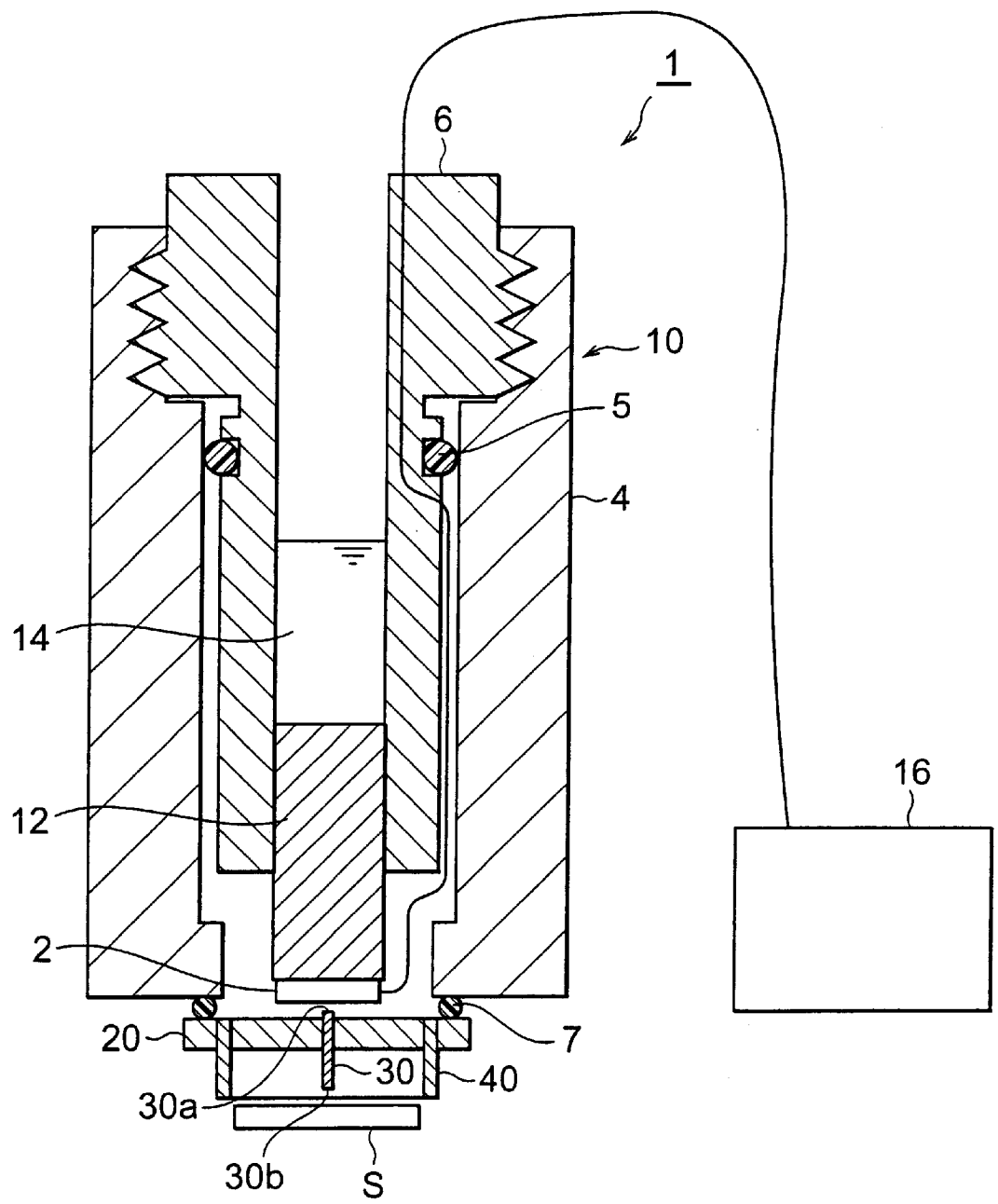
FIG. 2 is a sectional view showing a magnetic sensor according to the second embodiment of the present invention.

A magnetic sensor according to the second embodiment of the present invention will be described with reference to FIG. 2. This embodiment is different from the first embodiment in that a cylindrical flux absorbing member 40 is provided around a flux introducing member 30 in order to surround a lower end 30b of the flux introducing member 30 which is located outside a storing portion 10. The flux absorbing member 40 is made of a high-permeability material such as permalloy, and absorbs an external magnetic flux from except a measurement target S. Hence, the measurement precision for the magnetic field distribution of the measurement target S can be further improved. The area of the open end of the flux absorbing member 40 on a SQUID 2 side is preferably larger than the area of the SQUID 2. With this arrangement, the magnetic flux absorbed by the flux absorbing member 40 can be prevented from flowing into the SQUID 2, so the measurement precision for the magnetic field distribution can be further improved.

The invention made by the present inventors has been described in detail by way of its embodiments. Note that the present invention is not limited to the above embodiments. For example, the flux introducing member need not have a needle-like shape as far as it has a rod-like shape, and can have a columnar shape, prismatic shape, or the like. If the measurement target is comparatively large like the human chest, one magnetic sensor may have a plurality of sets of SQUIDs and flux introducing members. The arrangement of the storing portion is not limited to that described above, and can be of any type as far as its interior can be held in vacuum. The mechanism for cooling the SQUID can also be changed in various manners.

Industrial Applicability

As has been described above, the magnetic sensor according to the present invention has the needle-like, flux introducing member with one end located in the storing portion and the other end located outside the storing portion. Hence, the magnetic flux from the measurement target can be guided to the SQUID by moving that side of the flux introducing member which is located outside the storing portion to the measurement target. In this manner, according to the present invention, since the other end side of the flux introducing member is located outside the storing portion, the distance between the flux introducing member and measurement target can be decreased even if the measurement target is not set in the container. Thus, cumbersome measurement preparation is not required, and measurement precision for the magnetic field distribution can be improved. Since one end of the flux introducing member is away from the SQUID, heat from the other end side of the flux introducing member is not easily transferred to the SQUID, so the SQUID can be cooled efficiently.

What is claimed is:

1. A magnetic sensor for measuring a magnetic field distribution of a measurement target by using a SQUID, characterized by comprising:

a storing portion with an interior held in a vacuum state to store the SQUID; and a rod-like flux introducing member made of a high-permeability material to guide a magnetic flux from the measurement target to the SQUID, wherein said flux introducing member has one end located in said storing portion to be away from the SQUID and the other end located outside said storing portion.

2. A magnetic sensor according to claim 1, characterized by further comprising a flux absorbing member made of a high-permeability material around said flux introducing member in order to surround a portion of said flux introducing portion which is located outside said storing portion.

3. A magnetic sensor according to claim 1 or 2, characterized in that said flux introducing member is made of permalloy.

* * * * *